United States Patent
Oleksinski et al.

(10) Patent No.: US 7,062,736 B2
(45) Date of Patent: Jun. 13, 2006

(54) TIMING CONSTRAINT GENERATOR

(75) Inventors: Nicholas A. Oleksinski, Northville, MI (US); Michael A. Minter, Bowling Green, KY (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/602,937

(22) Filed: Jun. 24, 2003

(65) Prior Publication Data

US 2004/0268279 A1 Dec. 30, 2004

(51) Int. Cl.
*G06F 17/50* (2006.01)

(52) U.S. Cl. .............................................. 716/6; 716/5
(58) Field of Classification Search ................ 716/1–6, 716/16–18
See application file for complete search history.

(56) References Cited

U.S. PATENT DOCUMENTS

| 5,644,498 | A | * | 7/1997 | Joly et al. ....................... 716/2 |
| 5,825,658 | A | * | 10/1998 | Ginetti et al. ................... 716/6 |
| 5,864,487 | A | * | 1/1999 | Merryman et al. ............. 716/6 |
| 5,956,256 | A | * | 9/1999 | Rezek et al. .................... 716/3 |
| 2003/0009734 | A1 | * | 1/2003 | Burks et al. .................... 716/6 |
| 2003/0014724 | A1 | * | 1/2003 | Kojima et al. ................. 716/10 |
| 2004/0025129 | A1 | * | 2/2004 | Batchelor ........................ 716/6 |
| 2004/0230933 | A1 | * | 11/2004 | Weaver et al. ................. 716/12 |

* cited by examiner

*Primary Examiner*—Vuthe Siek
*Assistant Examiner*—Binh Tat
(74) *Attorney, Agent, or Firm*—Christopher P. Maiorana, P.C.

(57) ABSTRACT

A method for generating a plurality of timing constraints for a circuit design is disclosed. The method generally includes the steps of (A) identifying a plurality of clock signals by analyzing the circuit design, (B) determining a plurality of relationships among the clock signals and (C) generating the timing constraints for the circuit design in response to the clock signals and the relationships.

20 Claims, 4 Drawing Sheets

US 7,062,736 B2

TIMING CONSTRAINT GENERATOR

FIELD OF THE INVENTION

The present invention relates to automatic circuit design analysis generally and, more particularly, to a method and/or architecture for a timing constraint generator.

BACKGROUND OF THE INVENTION

Some challenges facing turnaround times for application specific integrated circuit designs are to insure that the designs are timely, syntactically correct, accurate, and have complete timing constraints. Because so many tools are now driven by timing constraints in the back end of design processes, timing constraint deliverables have become as important as netlists to layouts for the circuits.

Conventional solutions involve hand-coding timing constraints based on design knowledge. Hand-coding the constraints involves experience with not only constraint syntax, as each back end tool may read constraints differently, but also familiarity with the design at the given level of back end processing. For instance, some design approaches typically use timing constraints for each level of a design on which timing driven placement and optimization are utilized. Problems can arise for the hand-coding approaches due to a lack of design expertise in the context of the constraints. For example, top level constraints are often the last items to get attention since the top level design is one of the last blocks to be constructed. Another disadvantage is a lack of expertise with a static timing analysis language. Chip vendors commonly teach the customers how to write constraints that are compatible with the tools used by the chip vendor. Constraints are commonly written in many useful ways, yet there is usually a best practice to apply that should be learned for each tool. Furthermore, humans make mistakes and constraints are missed because there is no deterministic, automated methodology to writing the constraints.

SUMMARY OF THE INVENTION

The present invention concerns a method for generating a plurality of timing constraints for a circuit design. The method generally comprises the steps of (A) identifying a plurality of clock signals by analyzing the circuit design, (B) determining a plurality of relationships among the clock signals, and (C) generating the timing constraints for the circuit design in response to the clock signals and the relationships.

The objects, features and advantages of the present invention include providing a method and/or architecture for a timing constraint generator that may (i) automate tracing of potential clock signal sources, (ii) automate tracing of all potential synchronous relationships among the clock signals, (iii) classify relationships as static timing analysis relationships or as exceptions, (iv) automatically generate timing constraints, (v) receive minimal input from a user and/or (vi) read a history file from a previous run to initialize options in a current run.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
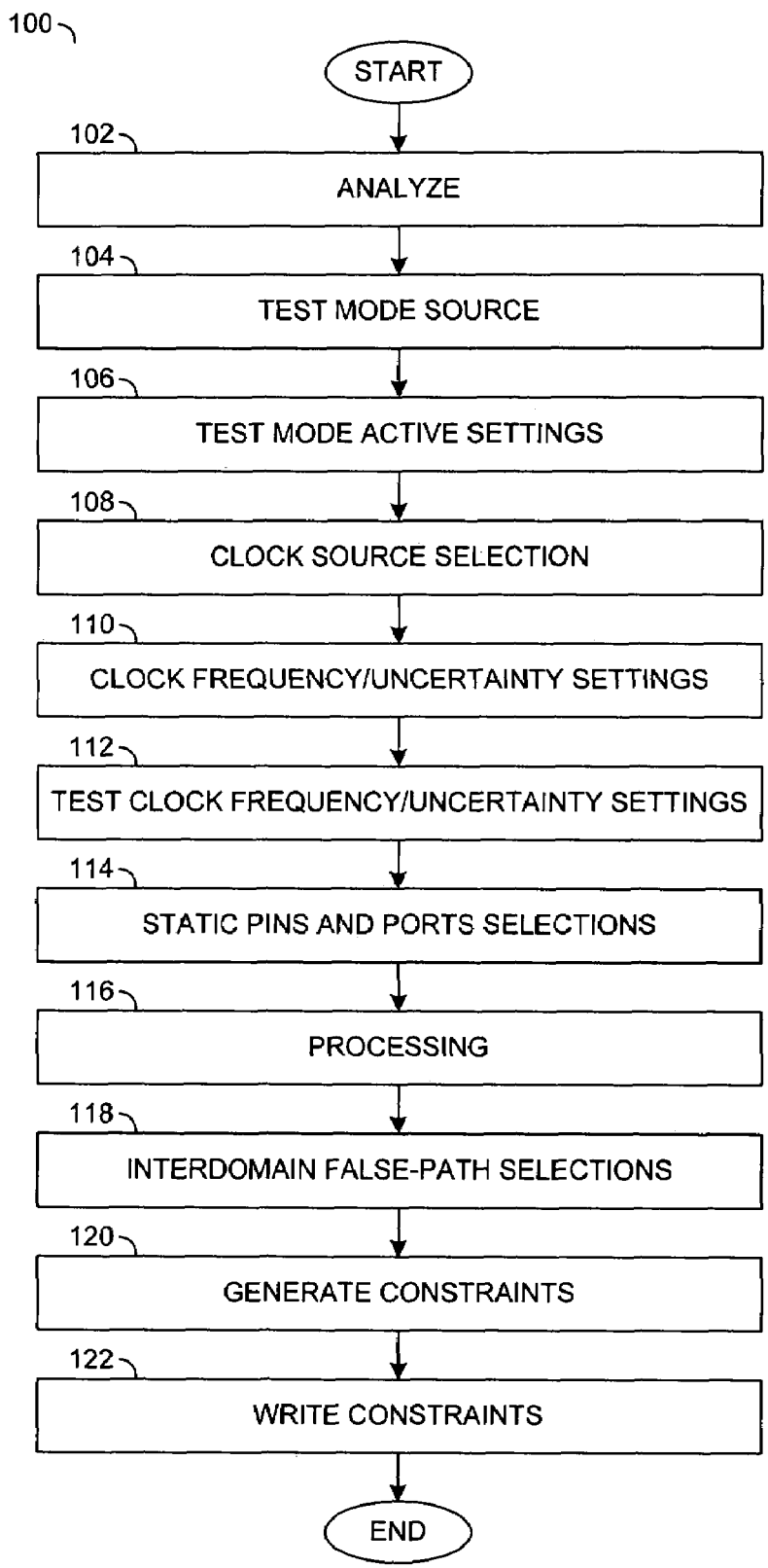
FIG. 1 is a flow diagram of a method for generating timing constraints in accordance with a preferred embodiment of the present invention.

Referring to FIG. 1, a flow diagram of a method 100 for generating timing constraints is shown in accordance with a preferred embodiment of the present invention. The method 100 generally finds all potential sources for apparent clock signals in a circuit design. The method 100 may then query a user about which clock signals may be used in a test mode and which clock signals may not be clock signals (e.g., gating pins, static pins, etc.). Additional queries may be made for the remaining clock signals for frequencies and timing uncertainties may be associated with each clock signal. The user may also be queried to identify test clock signal sources (e.g., clock signals that may be primary inputs) and the associated frequencies and timing uncertainties. Static pins and ports (e.g., false-path launch or capture points) may be received from the user. The method may then look at a structure of a netlist for the circuit design to find all clocking relationships, across all domains, and determine the timing constraints and exceptions to be created in a static timing analysis (STA) environment. Another query to the user may identify which clock domain crossings of the clock signals may be false paths. Finally, the timing constraints may be written among several files.

The method 100 may be implemented as a software tool or script that performs the user queries and subsequent processing based upon the circuit design and user supplied information. The method 100 generally begins by analyzing a netlist (e.g., a Verilog netlist) of the circuit design stored in a database. The analysis generally locates all potential sources of clock signals, including pins, ports and interfaces (e.g., block 102). The user may be queried to identify one or more multiplexing control sources, pins, ports or interfaces for multiplexing test clock signals into the rest of the circuit design (e.g., block 104). Further queries may be made to the user for a test clock multiplexing active mode setting (e.g., a logical one or a logical zero) for each test clock source, pin, port or interface routable through the multiplexer (e.g., block 106). The user may be asked to identify pins, ports and interfaces that may not be normal clock sources (e.g., block 108).

Queries may also be made as part of the method 100 to the user for various parameters for the clock signals/sources. For example, the user may supply mission mode frequencies and timing uncertainties for each clock signal that remains after various potential clock sources (e.g., truly non-clock signals) have been eliminated from the analysis (e.g., block 110). The method 100 may provide additional queries to the user for the test clock frequency parameters and timing uncertainty parameters for each of the test clock signals that comes from a primary input or external interface to the circuit design (e.g., block 112). Another query to the user may be performed to identify each of the pins, ports and interfaces that may be considered primary inputs but may convey non-clock signals (e.g., block 114). The non-clock signals and the signals on the pins, ports and interfaces that may be static may be removed from the static timing analysis (e.g., block 114).

The method 100 may further process the database looking for various relationships among the clock signals (e.g., block 116). For example, the method 100 may identify asynchronous clock crossings where two or more clock signals drive memory elements that exhibit interconnectivity on data input and output pins. Another relationship that may be a fastest clock relationship within clock boundary domains (e.g., between flip-flops, latches and/or registers). The fastest clock relationship may determine which of the clock signals within the domain has the fastest or highest frequency. Analysis of the database may be performed for clock signals multiplexed between different regions of the circuit design. Multiplexed clock signals may be designated has having a multiplexed relationship. One or more clock signals that may be derivatives of another clock signal may have a derivative relationship to the other clock signal. Derivative clock signals may define valid clock domain crossings. In another example, a shared structure relationship may be established where test structures (e.g., lockup latches and scan shift paths) may be constrained to relax timing requirements while the functional pins of the design remain constrained to the shortest functional cycle time.

After analyzing the database, the method 100 may query the user to identify which clock domain crossings may not be valid (e.g., block 118). Although the analysis may determine correct relationships in most instances, situations may arise where the method 100 may improperly identify a relationship that does not really exist between two or more clock signals. Therefore, a user indication of a non-valid clock domain crossing may override the processing (e.g., block 116) conclusion of a valid crossing even though the clock signals in question may be derivatives of each other. Thereafter, the method 100 may generate the timing constraints for the circuit design by performing a structural analysis (e.g., block 120) for the remaining clock signals.

After calculating the constraints, the resulting information may be stored among several files in a directory (e.g., a ptime subdirectory) (e.g., block 122). The different files may include, but are not limited to, a constraint file (e.g., CONST.PT) that may sensitize clock signal paths to the fastest clock signal for the clock domain. A clock file (e.g., CLOCK.PT) that may create clocks and virtual clocks, sets uncertainties, and write domain-based false path constraints for internal and input/output paths. An input file (e.g., INPUTS.PT) may store constraints for unidirectional inputs and bidirectional inputs per transitive fanout pin, to virtual clocks. An output file (e.g., OUTPUTS.PT) generally constrains unidirectional outputs and bidirectional outputs per transitive fanin pin, to virtual clocks. A crossing file (e.g., CROSSING.PT) may constrain internal pins that operate on derivative frequencies to a capture clock period. A false file (e.g., FALSE.PT) may store exceptions from static pins, ports and/or interfaces from the circuit design as instructed by the user. A multiplex file (e.g., MUXED_CLK.PT) generally stores constraints that may relax or tighten maximum delay constraints between pins on multiple-mode clock signals. A launch file (e.g., UNIQ_LAUNCH.PT) may be created to constrain synchronous relationships among one or more paths where the fastest functional clock which launches the synchronous signal (data) is faster than the fastest clock which captures the launched signal (data). A capture file (e.g., UNIQ_CAPTURE.PT) may be created to constrain synchronous relationships among one or more paths where the fastest functional clock which launches the synchronous signal (data) is slower than the fastest clock which captures the launched signal (data). A fanout file (e.g., HIFAN.PT) may identify loads removed from high fanout nets that may be synthesized later. A scan file (e.g., SCAN.PT) may be created to store test mode constraints on test-only pins (e.g., pins TE & TI). Another false file (e.g., FALSE_EXPLICIT.PT) generally stores explicit point-to-point false paths that may be used instead of a path from a first clock to a second clock as defined in the file CLOCK.PT. The file FALSE_EXPLICIT.PT may contain a listing of "invalid" clock domain crossings and may be provided for information purposes only.

Figure 2A:
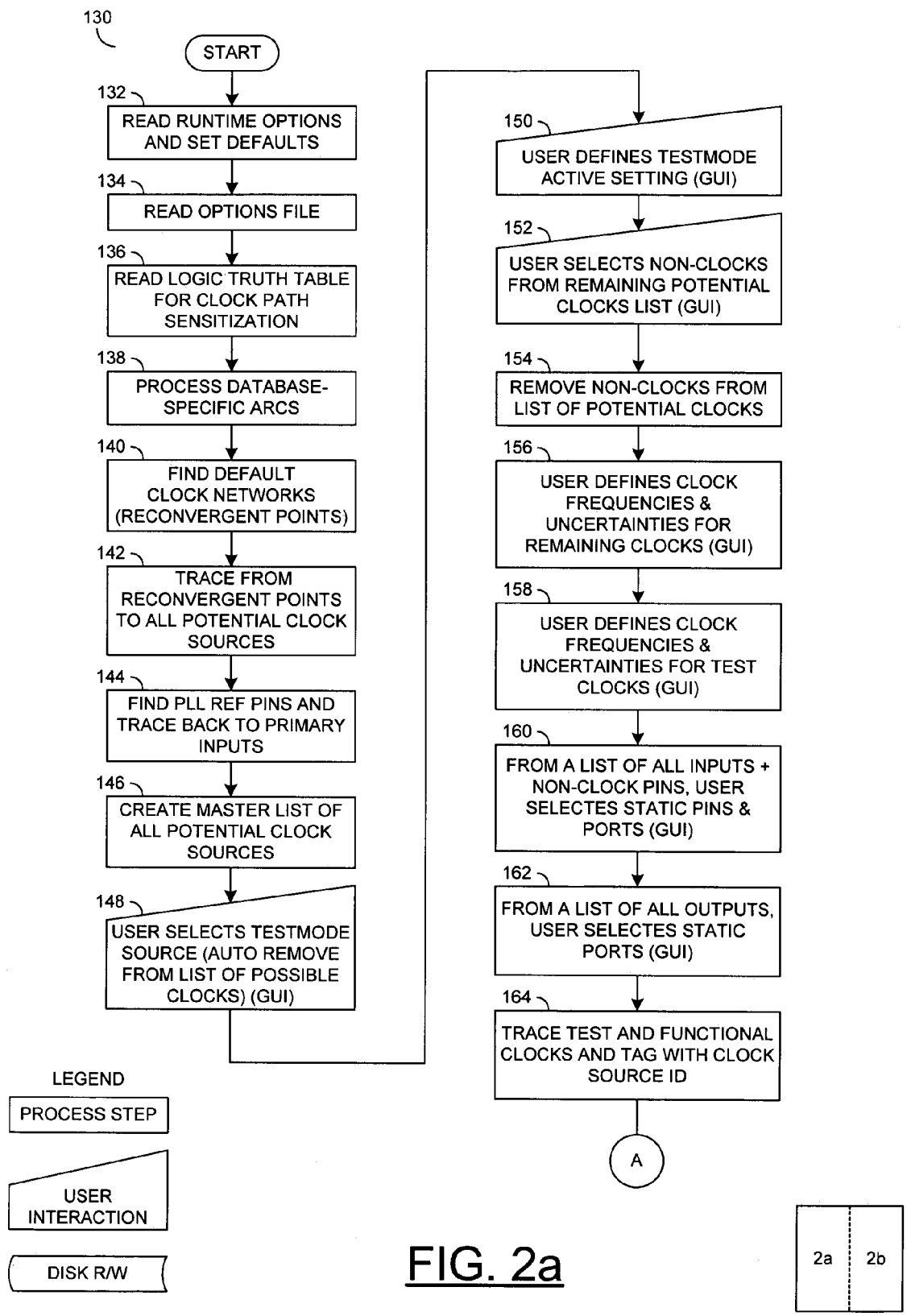
FIGS. 2a–b are a flow diagram for a method of operating a software tool.
Figure 2B:
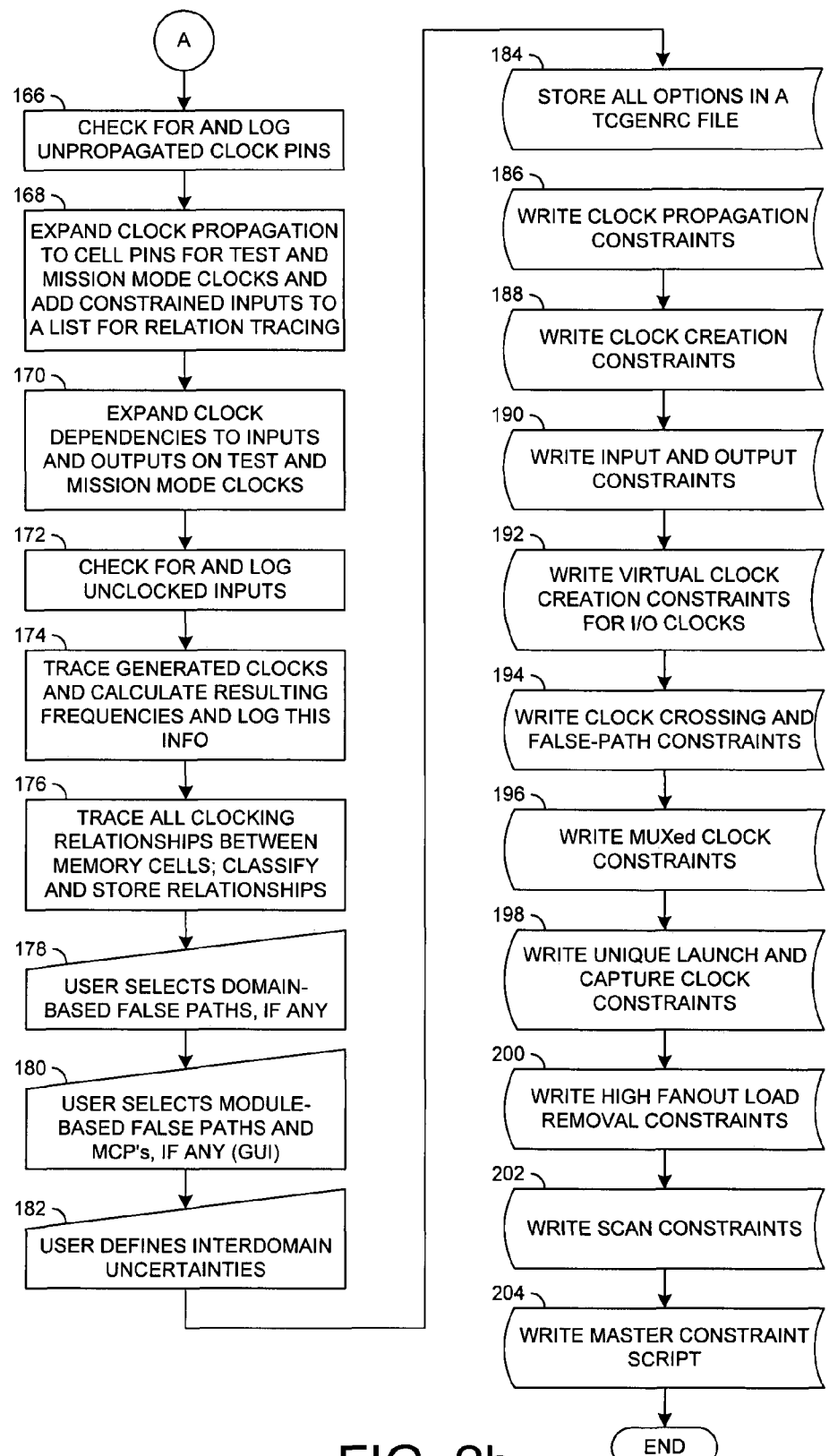

Referring to FIGS. 2a–b, a flow diagram for a method 130 of operating a software tool is shown. The software tool may begin by reading runtime options and set default values (e.g., block 132). Information stored in an option file may then be read (e.g., block 134). A truth table may also be read for clock path sensitization (e.g., block 136).

The software tool may process database-specific arcs for the circuit design stored in the database (e.g., block 138). Default clock networks may then be located to identify reconvergent points (e.g., block 140). Clock signals at the reconvergent points may be traced to identify all potential clock sources (e.g., block 142). The software tool may locate phase lock loop (PLL) reference pins and trace the reference pins to primary inputs of the circuit design (e.g., block 144). A master list is generally created for the identified potential clock sources and the associated clock signals (e.g., block 146).

A user may be queried to identify test mode clock signals (e.g., block 148). The software tool may remove the test clock source from the master list (e.g., block 148). A graphic user interface (GUI) may present the user with a "Test Mode Source" screen and request identification of test clock multiplexing pin or port. The identified pin or port may be considered a control signal. A "Test Mode Active Setting" screen may ask the user to identify a sense of the control signal to indicate activation of a test mode (e.g., block 150). For example, an entry of "1" may indicate that the control signal asserts the test mode while in a logical high state. An entry of "0" may indicate to the software tool that the control signal asserts the test mode while in a logical low state. A normal mode of operation may be asserted while the control signal is deasserted from the test mode.

A "Clock Source Selection" screen may be provided to the user for identification of the pins, ports and/or interfaces that may not be true clock signals (e.g., block 152). The software tool may then remove the signals on the identified pins, ports and interfaces from the master list of potential clock signals (e.g., block 154). A "Clock Frequency/Uncertainty Setting" screen may be displayed to the user for additional information related to the remaining clock signals in the master list (e.g., block 156). The user may enter a frequency and an uncertainty of each clock signal (e.g., block 156). For derived clock signals generated inside the circuit design from other clock signals, the user may enter a divide ratio for the derived clock signals. The divide ratio generally indicates a particular "Q" pin of a flip-flop that generates the derived clock signal. For PLL outputs, the user may enter a voltage control oscillator frequency.

A "Test Clock Frequency/Uncertainty Setting" screen may be displayed to the user for entry of information related to the test clock signals and sources. The user may enter the test frequencies and test uncertainties of each test clock signal (e.g., block 158). All of the test clock signals should enter the circuit design through a primary external interface.

A "Static Pin and Port Selection" screen generally allows the user to indicate the input ports and internal pins (once considered as possible clock signal sources) that may be essentially static (e.g., block 160). The "Static Pin and Port Selection" screen may also allow the user to identify the output ports that may be essentially static (e.g., block 162). The static input and output interfaces are generally not checked for input/output delays or clock gating.

The software tool generally continues by tracing the test clock signals and normal clock signals back to the associated clock sources. The clock sources may then be tagged with a unique identification value (e.g., block 164). A check may then be performed by the software tool for any un-propagated clock pins and the results logged (e.g., block 166). Clock propagation may be expanded to cell pins for the test mode clock signals and the normal clock signals. Constrained inputs may be added to a list for relational tracing (e.g., block 168). Clock dependencies may also be expanded to inputs and outputs for the test clock signals and the normal clock signals (e.g., block 170). The software tool then generally checks for and logs unclocked inputs (e.g., block 172). The software tool may trace clock signals and calculate resulting clock frequencies that may be subsequently logged (e.g., block 174). The software tool may then trace and store all clocking relationships between particular classes of modules or blocks (e.g., block 176). For example, traces may be conducted for clocking relationships between memory cells. The processing performed by the software tool generally takes an appreciable amount of time to complete.

An "Interdomain False-Path Selection" screen may be displayed to the user after the software tool has completed analyzing all clocking relationships (e.g., block 178). The tool generally notes all clock domain crossings and checks for asynchronous crossings. For example, on any clock signal crossing, the software tool may divide a faster clock by a slower clock within a clock domain. If the answer is an integer within a certain tolerance, the crossing may be considered as valid. Otherwise, the crossing may be tagged as a false crossing. All valid crossings may be put into the "Interdomain False-Path Selection" screen. The user may then be asked to identify each crossing that, even though valid per the software tool, is still a false crossing. The user may be queried to identify module-based false paths and multi-cycle paths (MCP), if any (e.g., block 180). The user may also enter user defined interdomain uncertainties for identified clock signals (e.g., block 182).

The user may also have an option to explicitly adjust input and output delay constraints. The user defined delay constraints may override defaults values that may not be adjusted by the user until after the tool has finished. Furthermore, the user may have an option to enter jitter specifications for clock signals generated by phase-lock loop modules within the circuit.

After all relationships have been determined, the software tool generally writes all of the constraint files and runtime variables into one or more directories (e.g., a PTIME directory). Options may be stored in a file (e.g., TCGENRC) (e.g., block 184). The file TCGENRC may be a design-dependent startup file that provides a "memory" for the tool. When the tool is rerun, the file TCGENRC may be read and user entries and values may be restored. The file TCGENRC is generally rewritten after every GUI query with the user so that the latest settings may always be preserved. The TCGENRC file is generally written in a human-readable format and may potentially be delivered by a customer as a first-pass timing specification for the circuit design.

Additional files may be generated and stored by the software tool. A file (e.g., TCGEN_TRUTHTABLE) may tell the software tool how to sensitize a standard cell pin. Cells found in the database and not in the truth table may be reported to the user so that the missing cells may be manually added to the truth table. A log file (e.g., TCGEN.LOG) may operate as a general log file for the tool. The file TCGEN.LOG generally contains high-level information, warning and error messages. An error logging file (e.g., TCGEN_ERR.LOG) generally stores detailed error information for the tool. The file TCGEN_ERR.LOG may contain individual path information for undefined or unrecognized relationships, information such as unclocked cells and other similar information. A file (e.g., MISCINFO.LOG) may contain debug information that may be removed once the timing constraint generator tool has reached a distribution state.

The software tool may write clock signal propagation constraints to a hard drive (e.g., block 186). Clock signal creation constraints may also be written (e.g., block 188). Constraints associated with inputs and output may be written to another file (e.g., block 190). Virtual clock creation constraints for input/output clocks may be stored in a separate file (e.g., block 192). Clock crossing and false-path constraints may be written by the software tool (e.g., block 194). Multiplexed clock signals and control constraints may also be written to a file (e.g., block 196). Unique launch and capture clock constraints may be stored in another file (e.g., block 198). High fanout load removal constraints may also be written to a file (e.g., block 200). Scan constraints may be written to a separate file (e.g., block 202). Another file stored on the hard drive may hold master constraint scripts (e.g., block 204).

Several runtime variables may affect operation of the software tool. For example, a variable (e.g., quick) may be set to "1" to instruct a batch mode and "0" to instruct an interactive mode. In the batch mode, no GUI screen may be generated and existing choices and values may be read from the previously stored files for the batch run. A default value for the quick variable may be the interactive mode. Another variable (e.g., EN_PRECLR) may enable or disable a preset/clear of arcs for synchronous path tracing. A "1" may indicate enabling while a "0" may indicate disabling. The variable EN_PRECLR may default to disabled. A variable (e.g., DEF_FRQ) generally sets a default frequency for clocks on primary inputs. For example, if the user has knowledge that most of the design being analyzed runs at 200 megahertz (MHz), the user may set the default functional frequency to 200 MHz. Another variable (e.g., DEF_UNC) generally sets a default uncertainty for all other clocks besides the clocks on primary inputs. For the first run through the software tool, a default value of 0.25 MHz may be applied. A variable (e.g., DEF_TFRQ) may set a default frequency for test clocks on primary inputs. A default value for the test clocks on the primary inputs may be 20 MHz. Another variable (e.g., DEF_TUNC) generally sets a default uncertainty for all test clock signals not on primary inputs. A default value for non-primary test clock signals may be 1 MHz. A variable (e.g., DEF_DIV) generally sets a default divider for divided clocks. For the first run through the software tool, a default value of one-half may be applied. A variable (e.g., DEF_MIND) may set a default minimum delay value for synchronous relationships. The variable DEF_MIND may have a default value of zero. A variable (e.g., HIFAN_THR) may establish a high fanout threshold value, beyond which the tool may automatically write to a file constraints for a prelayout static timing analysis (e.g., set_load.pt) load removal. The variable HIFAN_THR may have a default value of fifty.

Figure 3:
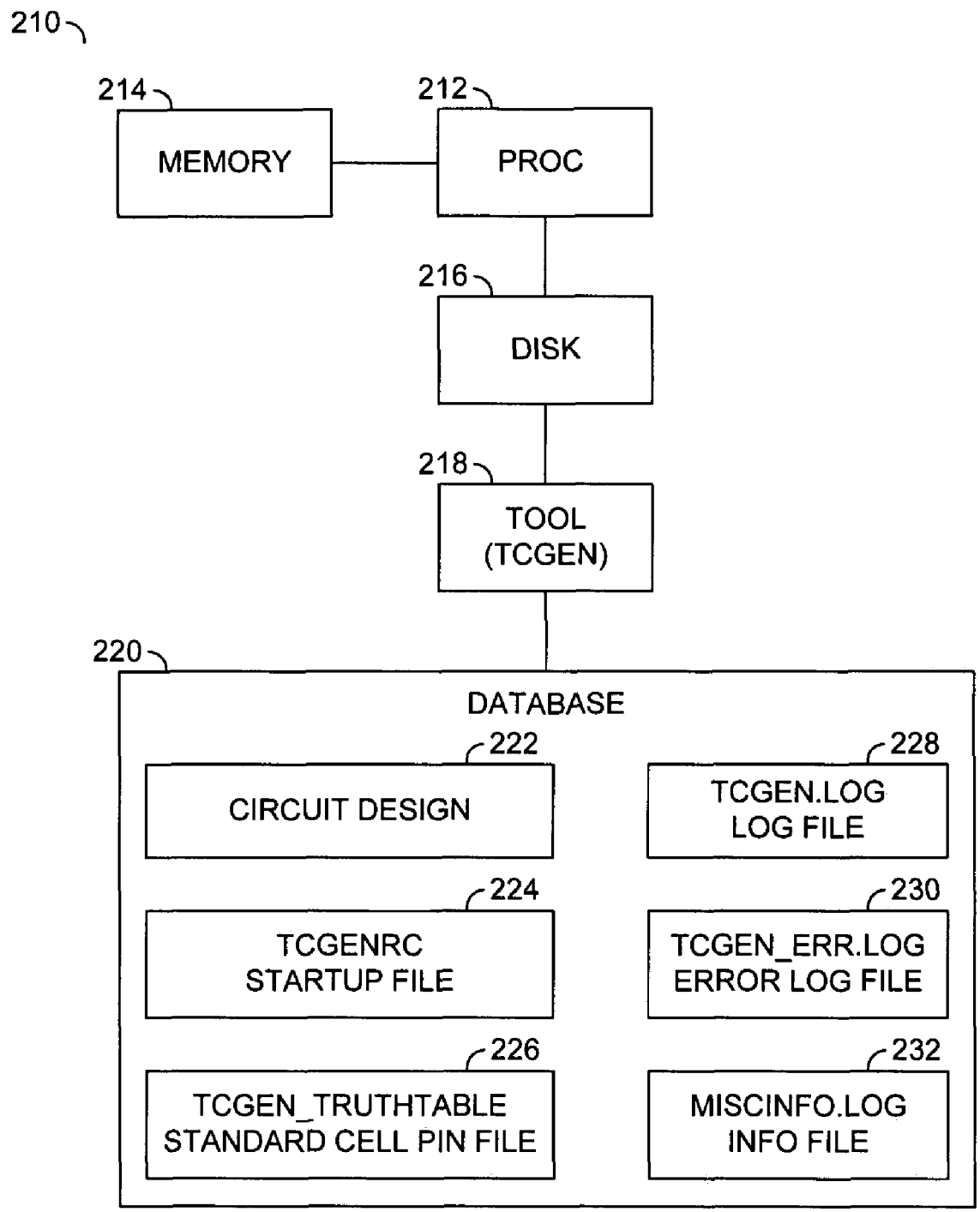
FIG. 3 is a block diagram of an example implementation of a system using the software tool.

Referring to FIG. 3, a block diagram of an example implementation of a system 210 using the software tool is shown. The system generally comprises a processor 212, a memory 214 and a disk memory 216. The disk memory 216 may store the software tool (e.g., TCGEN) 218 and a database 220. The software tool 218 may be copied to the memory 214 for execution by the processor 212. Other types of storage media may be used to hold the software tool to meet a criteria of a particular application of the system 210.

The database 220 may include multiple files 222–232. The file 222 may store the circuit design for which the timing constraints are to be generated. The file 224 may store the file TCGENRC. The file 226 may store the standard cell pin file TCGEN_TRUTHTABLE. The file 228 may store the log file TCGEN.LOG. The file 230 may store the error log file TCGEN-ERR.LOG. The file 232 may store the information file MISCINFO.LOG. Other files may be stored in the database 220 to meet the criteria of a particular application.

The present invention generally provides a generic automation solution to the problem of creating correct-by-construction timing constraints. With minimal input, the tool generally performs the analyses that is conventionally done empirically by the design engineers as constraints are developed during early timing runs in static timing analysis tools. The tool may be implemented to read a circuit design at gate level netlists. In another implementation, the tool may be implemented to read the circuit design from a register transfer language (RTL) source. Other implementations may be created to accept the circuit design in other formats to meet a design criteria of a particular application.

The function performed by the flow diagrams of FIGS. 1 and 2 may be implemented using a conventional general purpose digital computer programmed according to the teachings of the present specification, as will be apparent to those skilled in the relevant art(s). Appropriate software coding may readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which may be used to program a computer to perform a process in accordance with the present invention. The storage medium may include, but is not limited to, any type of disk including floppy disk, optical disk, CD-ROM, and magneto-optical disks, ROMs, RAMs, EPROMs, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for generating a plurality of timing constraints for a circuit design, comprising the steps of:
   (A) analyzing a netlist of said circuit design to identify a plurality of sources for a plurality of clock signals;
   (B) determining a plurality of relationships among said clock signals;
   (C) performing a structural analysis based on (i) said clock signals and (ii) said relationships to generate said timing constraints for said circuit design and
   (D) eliminating a respective tuning constraint of said timing constraints for each signal connected to an internal pin for said circuit design that defines a non-clock signal.

2. The method according to claim 1, wherein said plurality of clock signals comprise a test clock signal.

3. The method according to claim 1, further comprising the step of:
   eliminating a respective timing constraint of said timing constraints for each signal connected to an external interface for said circuit design that defines a non-clock signal.

4. The method according to claim 1, wherein said structural analysis is further based on a plurality of parameters associated with said clock signals.

5. The method according to claim 4, wherein at least one of said parameters relates to a test clock signal of said clock signals.

6. The method according to claim 1, further comprising the step of:
   eliminating a respective timing constraint of said timing constraints for each signal of said circuit design that defines a static signal.

7. The method according to claim 1, wherein step (B) comprises the sub-step of:
   generating an asynchronous relationship of said relationships between at least two of said clock signals operating asynchronously to each other.

8. The method according to claim 1, wherein step (B) comprises the sub-step of:
   generating a fastest clock relationship of said relationships between at least two of said clock signals operating at different speeds between two clock boundaries of said circuit design.

9. The method according to claim 1, wherein step (B) comprises the sub-step of:
   generating a multiplexed clock relationship of said relationships between at least two of said clock signals routable through a multiplexer in said circuit design.

10. The method according to claim 1, wherein step (B) comprises the sub-step of:
    generating a derivative clock relationship of said relationships between a first of said clock signals that is derived from a second of said clock signals.

11. The method according to claim 1, wherein step (B) comprises the sub-step of:
    generating a shared structure relationship of said relationships between a test clock signal of said clock signals and a normal clock signal of said clock signals, each driving a particular structure of said circuit design in different modes for said circuit design.

12. The method according to claim 1, further comprising the step of:
    writing said timing constraints among a plurality of files.

13. A method for generating a plurality of timing constraints for a circuit design, comprising the steps of:
    (A) analyzing a netlist of said circuit design to identify a plurality of sources for a plurality of clock signals;
    (B) querying a user for a plurality of parameters for said clock signals;
    (C) performing a structural analysis based on (i) said clock signals and (ii) said parameters to generate said timing constraints and (D) eliminating a respective tuning constraint of said timing constraints for each signal connected to an internal pin for said circuit design that defines a non-clock signal.

14. The method according to claim 13, further comprising the step of:

determining a plurality of relationships among said clock signals, wherein said timing constraints are generated in further response to said relationships.

15. The method according to claim 13, wherein step (B) comprises the sub-step of:

querying said user for a frequency parameter of said parameters for each of said clock signals.

16. The method according to claim 13, wherein step (B) comprises the sub-step of:

querying said user for a timing uncertainty parameter of said parameters for each of said clock signals.

17. The method according to claim 13, wherein said circuit design comprises a gate level design.

18. The method according to claim 13, wherein said circuit design comprises a register transfer language design.

19. A storage medium comprising a medium and a computer program for use in a computer to generate a plurality of timing constraints for a circuit design, said medium recording said computer program that is readable and executable by the computer, said computer program including the steps of:

(A) analyzing a netlist of said circuit design to identify a plurality of sources for a plurality of clock signals by analyzing said circuit design;

(B) determining a plurality of relationships among said clock signals;

(C) performing a structural analysis based on (i) said clock signals and (ii) said relationships to generate said timing constraints for said circuit design and (D) eliminating a respective tuning constraint of said timing constraints for each signal connected to an internal pin for said circuit design that defines a non-clock signal.

20. A storage medium comprising a medium and a computer program for use in a computer to generate a plurality of timing constraints for a circuit design, said medium recording said computer program that is readable and executable by the computer, said computer program including the steps of:

(A) analyzing a netlist of said circuit design to identify a plurality of sources for a plurality of clock signals by analyzing said circuit design;

(B) querying a user for a plurality of parameters for said clock signals;

(C) performing a structural analysis based on (i) said clock signals and (ii) said parameters to generate said timing constraints and (D) eliminating a respective tuning constraint of said timing constraints for each signal connected to an internal pin for said circuit design that defines a non-clock signal.

* * * * *